(12) United States Patent
Wert

(10) Patent No.: US 6,552,569 B2
(45) Date of Patent: Apr. 22, 2003

(54) DUAL PURPOSE LOW POWER INPUT CIRCUIT FOR A MEMORY DEVICE INTERFACE

(75) Inventor: Joseph Douglas Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/745,951

(22) Filed: Dec. 22, 2000

(65) Prior Publication Data

US 2002/0079922 A1 Jun. 27, 2002

(51) Int. Cl.$^7$ .................. H03K 19/0175; H03K 19/094
(52) U.S. Cl. .............. 326/68; 326/86; 327/77; 365/189.09
(58) Field of Search .............. 326/68, 70, 86, 326/83, 81, 80; 327/77, 333; 365/189.09

(56) References Cited

U.S. PATENT DOCUMENTS

| | | | |
|---|---|---|---|
| 5,696,456 A | 12/1997 | Lee | 326/70 |
| 5,949,252 A | 9/1999 | Taguchi | 326/86 |
| 6,020,761 A | 2/2000 | Hwang et al. | 326/80 |
| 6,023,175 A | * 2/2000 | Nunomiya et al. | 326/68 |
| 6,064,226 A | * 5/2000 | Earl | 326/68 |
| 6,104,216 A | 8/2000 | Satoh | 327/78 |
| 6,172,524 B1 | * 1/2001 | Cho | 326/70 |

* cited by examiner

Primary Examiner—Daniel Chang
(74) Attorney, Agent, or Firm—Davis Munck, P.C.

(57) ABSTRACT

For use in an integrated circuit interface to a memory device, there is disclosed an input circuit having an input interface that is capable of receiving one of a high speed, high power signal and a low speed, low power signal. The input circuit of the present invention is capable of preventing direct current leakage within the input circuit when the input circuit is operating in a low speed, low power mode. The input circuit of the present invention comprises a multiplexer that is capable of receiving both high speed, high power signals and low speed, low power signals. The input circuit of the present invention also comprises a switch that is capable of preventing a high speed, high power signal from causing direct current leakage within the input circuit when the input circuit is operating in a low speed, low power mode.

24 Claims, 3 Drawing Sheets

DUAL PURPOSE LOW POWER INPUT CIRCUIT FOR A MEMORY DEVICE INTERFACE

TECHNICAL FIELD OF THE INVENTION

The present invention is generally directed to an integrated circuit interface to a memory device and, more specifically, to an input interface for high-speed, high-power signals and low-speed, low-power signals in an integrated circuit interface to a memory device.

BACKGROUND OF THE INVENTION

In networking technology a "thin client" is a type of network appliance. A thin client has a minimal on-board operating system and functions by downloading applications from a remote server to run locally. Generally, a thin client has little storage capacity and frequently has no mass storage capability, such as a hard disk drive. For example, a thin client that is used with the Internet may be a television set top box that connects to the Internet. A thin client that is used with the Internet may sometimes be referred to as an "Internet appliance." An example of an Internet appliance is Compaq Computer's IPAQ-1.

The term "network appliance" will be used to refer to a thin client, an Internet appliance, and other similar types of equipment. A network appliance has the advantage of being much cheaper than a personal computer. Network appliances generally have a small form factor and are very quiet because there is no need for a fan. A network appliance is connected to a keyboard, television set or display and a network, usually a cable network. Network appliances are also available in battery powered and line current powered versions. With line current powered versions there is little need for restricting the processor to a low power drain circuit as there is plenty of power available. A line current network appliance is able to use Stub Series Terminated Transceiver Logic (SSTL) to drive double data rate (DDR) range in the random access memory (RAM) on board the network appliance. An input device utilizing SSTL is relatively fast, but has a substantial power requirement. On the other hand, a battery powered network appliance requires a low power drain because the on board RAM operates in the single data rate (SDR) range. The memory input device is thus a low power device. It is preferable to use Low Voltage Transistor-Transistor Transistor Logic (LVTTL) to power the memory.

LVTTL is commonly used to define voltage levels recognizable by low power memory devices. For instance, a relatively high voltage may be recognized as a one ("1"), while a relatively low voltage may be recognized as a zero ("0"). Input buffers or receivers in certain memory devices that receive these levels have to be able to recognize whether a voltage is intended to be a high or low voltage. LVTTL dictates that all voltages higher than a specified high input voltage are interpreted as a "high" voltage and all voltages lower than a specified low input voltage are interpreted as a "low" voltage.

Joint Electronic Devices Engineering Council (JEDEC) established an SSTL1 specification and later established an SSTL2 specification. In the SSTL2 specification, the legal voltage swings for direct current (DC) are from:

$VIH$ (high input voltage)=$VREF$+0.18 volts $VIL$ (low input voltage) =$VREF$−0.18 volts.

In the SSTL2 specification, the legal voltage swings for alternating current (AC) are from:

$VIH$ (high input voltage) $VREF$−0.35 volts $VIL$ (low input voltage)=$VREF$−0.35 volts.

The reason for the different voltages is that the alternating current is run at system speed (e.g., 200 MHz) and the additional swing in voltage gives better noise margins.

In prior art input circuits that operate using the SSTL2 specification the data signal only has to swing above or below VREF by four or five hundred millivolts. Therefore, any direct current leakage that occurs between transistors in the input circuit is not a concern. Direct current leakage occurs in the SSTL2 mode because the data signal does not swing from "rail to rail" (i.e., from a maximum voltage level equal to the positive supply voltage (VDD) to a minimum voltage level equal to the negative supply voltage (VSS)). In the LVTTL mode, however, the data signal is driven from "rail to rail" and direct current leakage is not desired.

There is a need in the art for a dual purpose input circuit that will provide an input interface for both SSTL2 signals and LVTTL signals, so that the input circuit can process either type of signal. There is also a need in the art for a dual purpose input circuit that will provide zero direct current leakage when the dual purpose input circuit is operating in the LVTTL mode. There is also a need in the art for a dual purpose input circuit to provide zero direct current leakage when data signal voltages are swinging from "rail to rail." There is also a need in the art for a dual purpose input circuit that will minimize the number of components in the input circuit and still provide zero direct current leakage when the input circuit is operating in the LVTTL mode.

SUMMARY OF THE INVENTION

To address the above-discussed deficiencies of the prior art, it is a primary object of the present invention to provide a dual purpose input circuit that is capable of processing both SSTL2 signals and LVTTL signals.

It is an additional object of the present invention to provide a dual purpose low power input circuit that is capable of reducing direct current leakage to zero when the input circuit is operating in an LVTTL mode.

The present invention comprises a multiplexer that is capable of receiving SSTL2 signals and LVTTL signals.

The present invention also comprises a switch containing a NAND gate that is capable of preventing the SSTL2 data signal from causing direct current leakage within the input circuit of the present invention when the input circuit is operating in an LVTTL mode.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the concept and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged input circuit.

Figure 1:
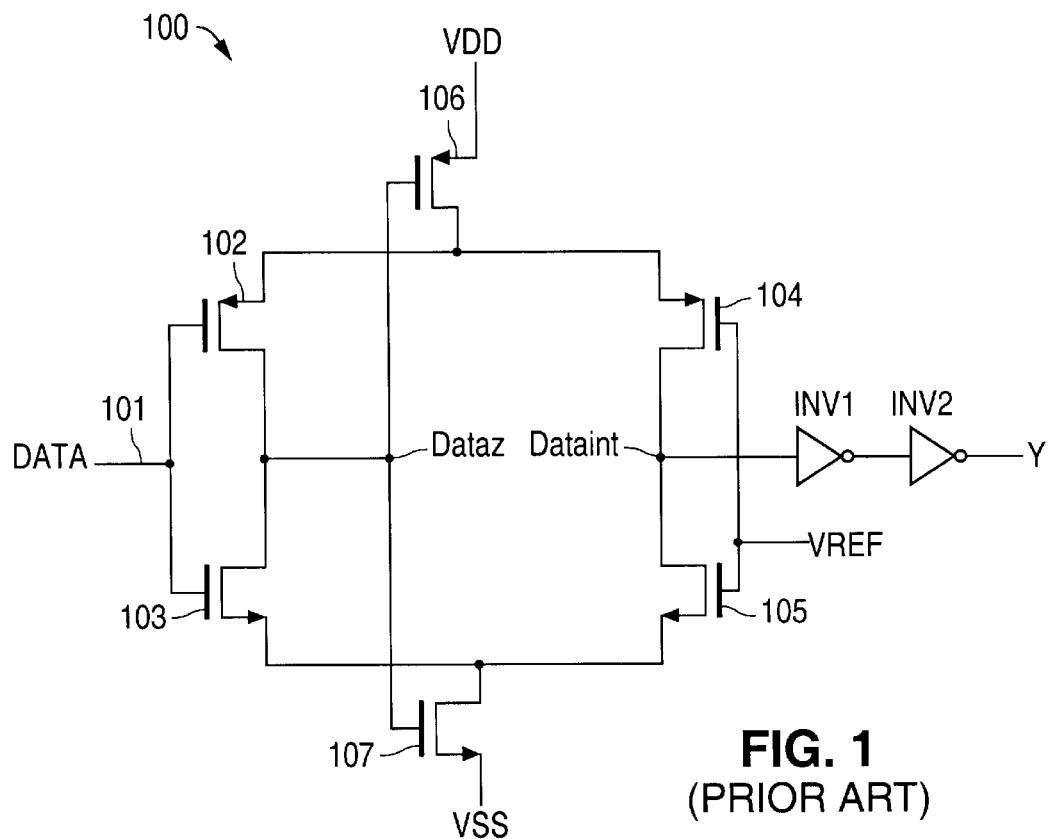
FIG. 1 illustrates a prior art low power input circuit for devices that meet Stub Series Terminated Transceiver Logic (SSTL) specifications.

FIG. 1 illustrates prior art input circuit 100 for devices that meet Stub Series Terminated Transceiver Logic (SSTL) specifications. Joint Electronic Devices Engineering Council (JEDEC) has established an SSTL1 specification and an SSTL2 specification. Input circuit 100 comprises a pseudo-differential amplifier capable of receiving signals that comply with SSTL1 and SSTL2 specifications. The SSTL2 specification provides a logic switching range that is nominally 0.0 volts to 2.5 volts. The circuit is a low power direct current (DC) circuit. As is well known to persons skilled in the art, both SSTL and Low Voltage Transistor Transistor Logic (LVTTL) are bus termination techniques. It is also well known that synchronous dynamic random access memory (SDRAM) operates using either LVTTL or SSTL. SSTL was created by the JEDEC Committee as an upgrade for LVTTL to improve operation where busses must be isolated from relatively large stubs. Busses can be terminated to an external termination voltage.

Input circuit 100 is referred to as a pseudo-differential amplifier because it is a differential amplifier with one side of the differential tied to a fixed reference voltage VREF.

VREF is usually set equal to one half of VDD, the positive supply voltage. Assume that VDD is equal to 2.5 volts and VREF is set equal to 1.25 volts. Depending upon input circuit sensitivity, when the voltage value on DATA input line 101 is above 1.25 volts, Dataint will be a "high" (i.e., at VDD), and when the voltage value on DATA input line 101 is below 1.25 volts, Dataint will be a "low" (i.e., at VSS). Dataint will swing from a maximum voltage level equal to positive supply voltage (VDD) to a minimum voltage level equal to negative supply voltage (VSS) (i.e., from "rail to rail").

The low power function of input circuit 100 is provided by p-type transistor 106 and n-type transistor 107. The voltage values at the Dataz node are the inverse of the voltage values on DATA input line 101. That is, the Dataz node signal is the inverse of the DATA signal. The voltage values of the Dataz node, however, swing from a high voltage level equal to VDD−1 Vth (where Vth is a threshold voltage level) to a low voltage level equal to VSS+1 Vth. A typical value of Vth is seven hundred twenty (720) millivolts.

If the voltage value on DATA input line 101 becomes greater than VREF, then n-type transistor 103 begins to pull down, increasing $V_{GS}$ (gate voltage with respect to the source) on p-type transistor 106 and hence increasing the drive strength. As the Dataz signal moves down, p-type transistor 106 is turned on at increasingly stronger levels and n-type transistor 107 is turned off. However, Dataz has a self-limiting swing. As Dataz swings lower, n-type transistor 107 is de-biased to a point where it cannot pull Dataz lower. The Dataint node is then driven to voltage level VDD through p-type transistors 106 and 104. However, current still flows from the drain of p-type transistor 106 to the drain of n-type transistor 107 because the Dataz signal does not move to the voltage level VSS, but to the voltage level VSS+1 Vth.

In the other direction, when the voltage value on DATA input line 101 becomes less than VREF, then the Dataz signal moves high turning on n-type transistor 107 and turning off p-type transistor 106. Again, the movement of the Dataz signal is limited because as it is driven high turning off p-type transistor 106, the transistor which is driving the Dataz node high is turned off. There is a leakage current between p-type transistor 106 and n-type transistor 107 because the Dataz node is driven to the voltage level VDD−1 Vth. In an LVTTL mode, the voltage values on DATA input line 101 swing "rail to rail" from VDD to VSS. However, the voltage values at the Dataz node will only swing from VDD−1 Vth to Vss+1 Vth. There will therefore be a direct current flowing between transistor 106 and transistor 107.

When operating in a double data rate (DDR) random access memory (RAM) data/memory control bits may operate as SSTL2 compatible cells. When that same circuit is operating with SDRAM, the inputs are configured to be LVTTL compatible. SDRAM is meant to be low power and if the SSTL2 structure is used the device draws a significant amount of current. For example, typical DDR RAM interface integrated circuit has one hundred four (104) data/memory control bits. Operating this number of bits with an SSTL2 input structure costs twenty one milliamps (21 mA) of direct current. This direct current requirement is greater than the direct current requirement for the rest of the integrated circuit.

Figure 2:
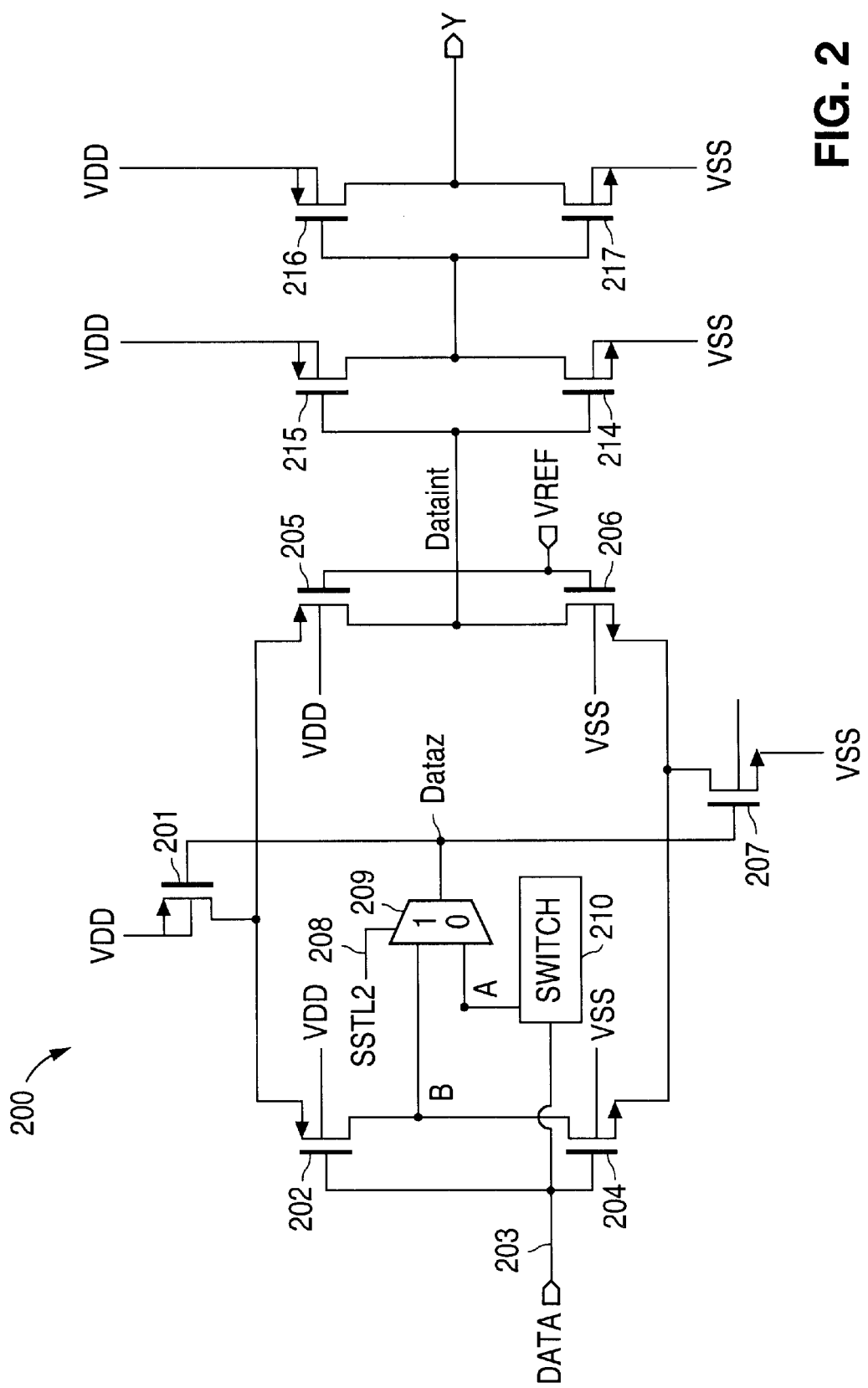
FIG. 2 illustrates a circuit diagram of an advantageous embodiment of the present invention for eliminating a direct current (DC) leakage in a low power input circuit.

FIG. 2 illustrates a circuit diagram of an advantageous embodiment of the present invention for eliminating direct current (DC) leakage in a low power input circuit. Input circuit 200 receives data on DATA input line 203 in either an SSTL2 format or in an LVTTL format. As shown in FIG. 2, input circuit 200 receives an identification signal ("SSTL2") on SSTL2 signal line 208 that identifies the type of input that is present on DATA input line 203. SSTL2 signal line 208 provides the SSTL2 identification signal to multiplexer 209. A "high" level on SSTL2 signal line 208 signifies that SSTL2 data is present on DATA input line 203. A "low" level on SSTL2 signal line 208 signifies that LVTTL data is present on DATA input line 203.

Figure 3:
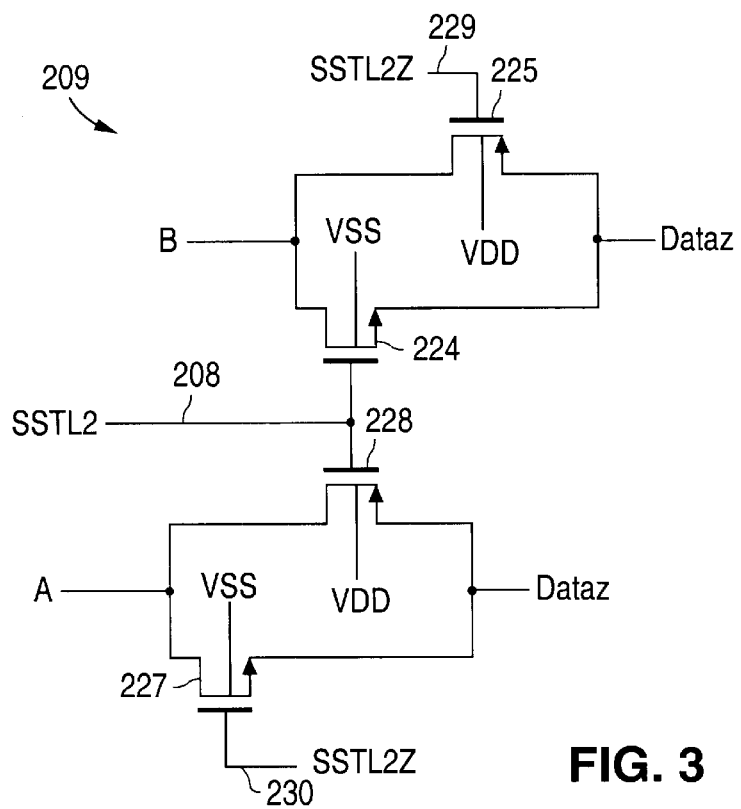
FIG. 3 illustrates a circuit diagram of an exemplary multiplexer used within the circuit shown in FIG. 2.

As shown in FIG. 2, node B is coupled to an input of multiplexer 209. When SSTL2 data is present on DATA input line 203, the voltage signal at node B is input to multiplexer 209. FIG. 3 shows multiplexer 209 in more detail. FIG. 3 may be referred to throughout the following discussion. When SSTL2 data is present on DATA input line 203, then multiplexer 209 receives a "high" level on SSTL2 signal line 208. When SSTL2 data is present on DATA input line 203, multiplexer 209 also receives a "low" level on SSTL2Z signal line 229 and on SSTL2Z signal line 230. The designation "SSTL2Z" on SSTL2Z signal line 229 signifies that signals that appear on SSTL2Z signal line 229 are the inverse of signals that appear on SSTL2 signal line 208. Similarly, the designation "SSTL2Z" on SSTL2Z signal line 230 signifies that signals that appear on SSTL2Z signal line 230 are the inverse of signals that appear on SSTL2 signal line 208.

When the SSTL2 signal on SSTL2 signal line 208 is "high" (and the SSTL2Z signal on SSTL2Z signal line 229 is "low"), multiplexer 209 sends the voltage signal that is present at node B to the Dataz node. This mode of operation makes input circuit 200 equivalent to input circuit 100. That is, when SSTL2 data is present on DATA input line 203 of input circuit 200, then input circuit 200 operates in the same manner as input circuit 100.

However, when LVTTL data is present on DATA input line 203, the SSTL2 signal on SSTL2 signal line 208 is "low" and the SSTL2Z signals on SSTL2Z signal line 229 and on SSTL2Z signal line 230 are "high". In this mode of operation multiplexer 209 sends the voltage signal that is present at node A to the Dataz node.

Figure 4:
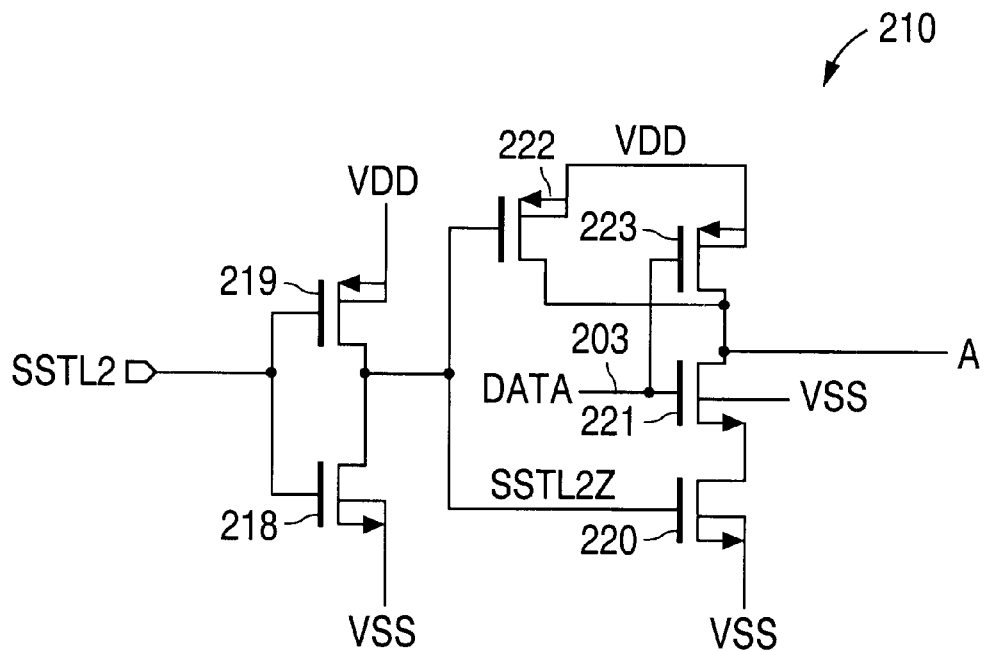
FIG. 4 illustrates a circuit diagram of an exemplary switch used within the circuit shown in FIG. 2.
Figure 5:
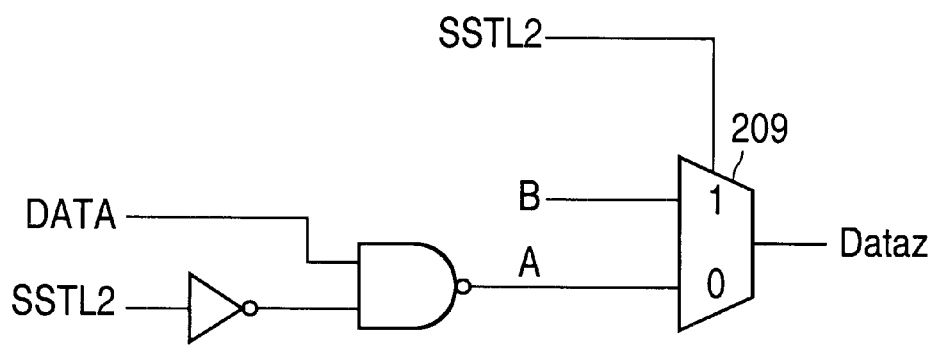
FIG. 5 illustrates a logic diagram showing the logical operation of the switch and multiplexer of the present invention.

As shown in FIG. 2 multiplexer 209 receives the voltage signal that is present at node A from the output of switch 210. FIG. 4 shows switch 210 in more detail. FIG. 4 may be referred to throughout the following discussion. Switch 210 receives data from DATA input line 203. DATA input line 203 is coupled to a first input of a NAND gate composed of transistor 220, transistor 221, transistor 222, and transistor 223. The second input of the aforementioned NAND gate receives an SSTL2Z signal (generated by inverting the incoming SSTL2 signal utilizing the inverter formed by transistor 218 and transistor 219).

When the SSTL2 signal is "low" (signifying the presence of LVTTL data), then the NAND gate of switch 210 sends a signal to node A that is an inverted version of the data signal that appears on DATA input line 203. This may be more clearly understood by referring to the diagram shown in FIG. 5. When the SSTL2 signal is "low," in this instance by a configuration register inside the circuit, then its inverted signal (i.e., SSTL2Z) is "high." The "high" level of SSTL2Z enables the NAND gate in switch 210 to pass an inverted version of the input data from DATA input line 203 to node A. Then multiplexer 209 sends the voltage signal that is present at node A to the Dataz node.

Because the LVTTL signal at node A switches from "rail to rail," the LVTTL signal present at the Dataz node from node A also switches from "rail to rail." Therefore either transistor 201 or transistor 207 is turned off when input circuit 200 has settled from the transient switching condition. Then there is no direct current leaking through either transistor 201 or transistor 207.

When the SSTL2 signal is "high" (signifying the presence of SSTL data) then the NAND gate of switch 210 keeps the limited swing of the SSTL2 data signal that is present on DATA input line 203 from causing direct current leakage between transistor 201 and transistor 207.

In this manner the present invention provides a dual purpose low power input circuit that is capable of receiving SSTL2 signals and LVTTL signals. The present invention provides a system for reducing direct current leakage to zero when the dual purpose input circuit is operating in the LVTTL mode.

Although the present invention has been described in detail, those skilled in the art should understand that they can make various changes, substitutions and alterations herein without departing from the spirit and scope of the invention in its broadest form.

What is claimed is:

1. For use in an integrated circuit interface to a memory device, an input circuit having an input interface that is capable of receiving one of a high speed, high power signal and a low speed, low power signal on a data input line of said input circuit, wherein said input circuit comprises:

a direct current leakage prevention circuit that is capable of providing zero direct current leakage in said input circuit when said input circuit is receiving said low speed, low power signal on said data input line of said input circuit.

2. The input circuit as set forth in claim 1 wherein said high speed, high power signal comprises a signal that meets a stub series terminated transceiver specification.

3. The input circuit as set forth in claim 1 wherein said low speed, low power signal comprises a signal that meets a low voltage transistor transistor logic specification.

4. The input circuit as set forth in claim 1 wherein said direct current leakage prevention circuit comprises:

a multiplexer that is capable of receiving said high speed, high power signal and said low speed, low power signal; and a switch coupled to said multiplexer, wherein said switch has an input coupled to a data signal that is present on said data input line of said input circuit, and wherein said switch is capable of preventing said low speed, low power signal from causing direct current leakage within said input circuit when said input circuit is operating in a low speed, low power mode.

5. The input circuit as set forth in claim 4 wherein said high speed, high power signal is a signal that meets a stub series terminated transceiver logic specification.

6. The input circuit as set forth in claim 4 wherein said low speed, low power signal is a signal that meets a low voltage transistor transistor logic specification.

7. The input circuit as set forth in claim 4 further comprising an identification signal line coupled to said multiplexer, wherein said identification signal line is capable of providing an identification signal to said multiplexer that identifies a type of input that is present on a data input line of said input circuit.

8. The input circuit as set forth in claim 7 wherein a high level on said identification signal line signifies that a high speed, high power signal is present on said data input line of said input circuit.

9. The input circuit as set forth in claim 7 wherein a low level on said identification signal line signifies that a low speed, low power signal is present on said data input line of said input circuit.

10. The input circuit as set forth in claim 7 wherein said switch coupled to said multiplexer comprises a NAND gate having as a first input the data signal that is present on said data input line of said input circuit, and having as a second input an inverted version of said identification signal that is provided to said multiplexer.

11. The input circuit as set forth in claim 10 wherein said switch reduces to zero the amount of direct current leakage within said input circuit when said low speed, low power signal is present on said data input line of said input circuit.

12. The input circuit as set forth in claim 11 wherein said low speed, low power signal comprises a signal that meets a low voltage transistor transistor logic specification.

13. A network appliance comprising an input circuit to an integrated interface to a memory device, said input circuit having an input interface that is capable of receiving one of a high speed, high power signal and a low speed, low power signal on a data input line of said input circuit, wherein said input circuit comprises:

a direct current leakage prevention circuit that is capable of providing zero direct current leakage in said input circuit when said input circuit is receiving said low speed, low power signal on said data input line of said input circuit.

14. The network appliance as set forth in claim 13 wherein said high speed, high power signal comprises a signal that meets a stub series terminated transceiver specification.

15. The network appliance as set forth in claim 13 wherein said low speed, low power signal comprises a signal that meets a low voltage transistor transistor logic specification.

16. The network appliance as set forth in claim 13 wherein said direct current leakage prevention circuit comprises:

a multiplexer that is capable of receiving said high speed, high power signal and said low speed, low power signal; and a switch coupled to said multiplexer, wherein said switch has an input coupled to a data signal that is present on said data input line of said input circuit, and wherein said switch is capable of preventing said low speed, low power signal from causing direct current leakage within said input circuit when said input circuit is operating in a low speed, low power mode.

17. The network appliance as set forth in claim 16 wherein said high speed, high power signal is a signal that meets a stub series terminated transceiver logic specification.

18. The network appliance as set forth in claim 16 wherein said low speed, low power signal is a signal that meets a low voltage transistor transistor logic specification.

19. The network appliance as set forth in claim 16 wherein said direct current leakage prevention circuit further comprises an identification signal line coupled to said multiplexer, wherein said identification signal line is capable of providing an identification signal to said multiplexer that identifies a type of input that is present on a data input line of said input circuit.

20. The network appliance as set forth in claim 19 wherein a high level on said identification signal line signifies that a high speed, high power signal is present on said data input line of said input circuit.

21. The network appliance as set forth in claim 19 wherein a low level on said identification signal line signifies that a low speed, low power signal is present on said data input line of said input circuit.

22. The network appliance as set forth in claim 19 wherein said switch coupled to said multiplexer comprises a NAND gate having as a first input the data signal that is present on said data input line of said input circuit, and having as a second input an inverted version of said identification signal that is provided to said multiplexer.

23. The network appliance as set forth in claim 22 wherein said switch reduces to zero the amount of direct current leakage within said input circuit when said low speed, low power signal is present on said data input line of said input circuit.

24. The network appliance as set forth in claim 23 wherein said low speed, low power signal comprises a signal that meets a low voltage transistor transistor logic specification.

* * * * *